(12) United States Patent  (10) Patent No.: US 8,956,806 B2
Wang et al.  (45) Date of Patent: Feb. 17, 2015

(54) PHOTORESIST AND PATTERNING PROCESS

(75) Inventors: Chien-Wei Wang, Wufong Township, Taichung County (TW); Ching-Yu Chang, Yilang County (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 850 days.

(21) Appl. No.: 12/562,761

(22) Filed: Sep. 18, 2009

(65) Prior Publication Data

US 2011/0070542 A1  Mar. 24, 2011

(51) Int. Cl.
| | | |
|---|---|---|
| G03F 7/004 | (2006.01) | |
| G03F 7/038 | (2006.01) | |
| G03F 7/039 | (2006.01) | |
| G03F 7/20 | (2006.01) | |
| G03F 7/30 | (2006.01) | |

(52) U.S. Cl.
USPC ............. 430/311; 430/270.1; 430/272.1; 430/275.1; 430/325; 430/326; 430/330; 430/919; 430/920; 430/921

(58) Field of Classification Search
None
See application file for complete search history.

(56) References Cited

U.S. PATENT DOCUMENTS

| | | | |
|---|---|---|---|
| 5,627,010 A | 5/1997 | Pai et al. | |
| 5,650,261 A * | 7/1997 | Winkle | 430/270.1 |
| 6,338,934 B1 | 1/2002 | Chen et al. | |
| 6,365,320 B1 * | 4/2002 | Foote et al. | 430/270.1 |
| 6,395,451 B1 | 5/2002 | Jung et al. | |
| 6,551,973 B1 | 4/2003 | Moore | |
| 6,884,561 B2 | 4/2005 | Fromson et al. | |
| 6,967,072 B2 * | 11/2005 | Latchford et al. | 430/311 |
| 7,005,229 B2 | 2/2006 | Nirmal et al. | |
| 7,229,747 B2 | 6/2007 | Park et al. | |
| 7,507,520 B2 | 3/2009 | Lee et al. | |
| 7,645,812 B2 | 1/2010 | Ahn et al. | |
| 8,216,767 B2 | 7/2012 | Wang et al. | |
| 2002/0160318 A1 * | 10/2002 | Richter et al. | 430/324 |
| 2002/0187436 A1 * | 12/2002 | Richter et al. | 430/322 |
| 2003/0134221 A1 * | 7/2003 | Nishiyama et al. | 430/170 |
| 2003/0138737 A1 | 7/2003 | Wakiya et al. | |
| 2004/0106532 A1 | 6/2004 | Yokoi et al. | |

(Continued)

FOREIGN PATENT DOCUMENTS

| | | |
|---|---|---|
| EP | 2093269 | 8/2009 |
| JP | 04134348 | 5/1992 |
| JP | 11251214 | 9/1999 |

(Continued)

OTHER PUBLICATIONS

English abstract for KR 20010028348 A (Kong et al), Apr. 2001.*

(Continued)

*Primary Examiner* — Sin Lee
(74) *Attorney, Agent, or Firm* — Haynes and Boone, LLP (57) ABSTRACT

A method and material layer for forming a pattern are disclosed. The method includes providing a substrate; forming a first material layer over the substrate; forming a second material layer over the first material layer, wherein the second material layer comprises a photoacid generator and a photobase generator; and exposing one or more portions of the second material layer.

20 Claims, 3 Drawing Sheets

(56) References Cited

U.S. PATENT DOCUMENTS

| | | |
|---|---|---|
| 2004/0265754 A1* | 12/2004 | Barclay et al. ............... 430/322 |
| 2010/0151386 A1 | 6/2010 | Shimizu et al. |
| 2010/0297419 A1 | 11/2010 | Courtenay et al. |
| 2011/0076624 A1 | 3/2011 | Wang et al. |
| 2011/0097669 A1 | 4/2011 | Fukui et al. |

FOREIGN PATENT DOCUMENTS

| | | |
|---|---|---|
| JP | 2009036960 | 2/2009 |
| WO | WO-2009/094023 | 7/2009 |

OTHER PUBLICATIONS

Wen-Li Wu et al., "Identifying Materials Limits of Chemically Amplified Photoresists", Advances in Resist Materials and Processing Technology XXIV, Proc. of SPIE vol. 6519, 651902 (2007), 0277-0786X/07, 11 pages.

Cyril Nicolas et al., "Catalytic Aerobic Photooxidation of Primary Benzylic Amines Using HIndered Acridinium Salts", www.sciencedirect.com, May 23, 2005, 4 pages.

R.M. Finne et al., "A Water-Amine-Complexing Agent System for Etching Silicon", Journal of the Electrochemical Society, vol. 114, Issue 9, pp. 965-970, Sep. 1967.

* cited by examiner

ABSTRACT
PHOTORESIST AND PATTERNING PROCESS

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, conventional photoresist layers comprise a base, which is not photosensitive. Thus, after an exposure process, exposed areas of a photoresist layer may exhibit less than desirable acid distribution contrast and base distribution contrast. This leads to lower pattern contrast, resulting in poor pattern profiles and/or poor resolution, particularly as pattern features continue to decrease in size.

Accordingly, what is needed is a method and photoresist material for manufacturing an integrated circuit device that addresses the above stated issues.

SUMMARY

A photoresist material for semiconductor device patterning processes is provided. The photoresist material comprises a polymer, a photoacid generator, a quencher base, a chromophore, a solvent, and a photobase generator. The photobase generator includes at least one of a carbamate, a carbamoylhydroxylamine, an oxime, a sulfonamide, or a lactam. The photoresist material may further comprise at least one of a chromophore, a solvent, a surfactant, photodegradable base, and/or crosslinker.

A method for fabricating an integrated circuit device is also disclosed. The method includes providing a substrate; forming a first material layer over the substrate; forming a second material layer over the first material layer, wherein the second material layer comprises a photoacid generator and a photobase generator; and exposing one or more portions of the second material layer

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to methods for manufacturing semiconductor devices, and more particularly, to a method and photoresist for patterning various semiconductor device features.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
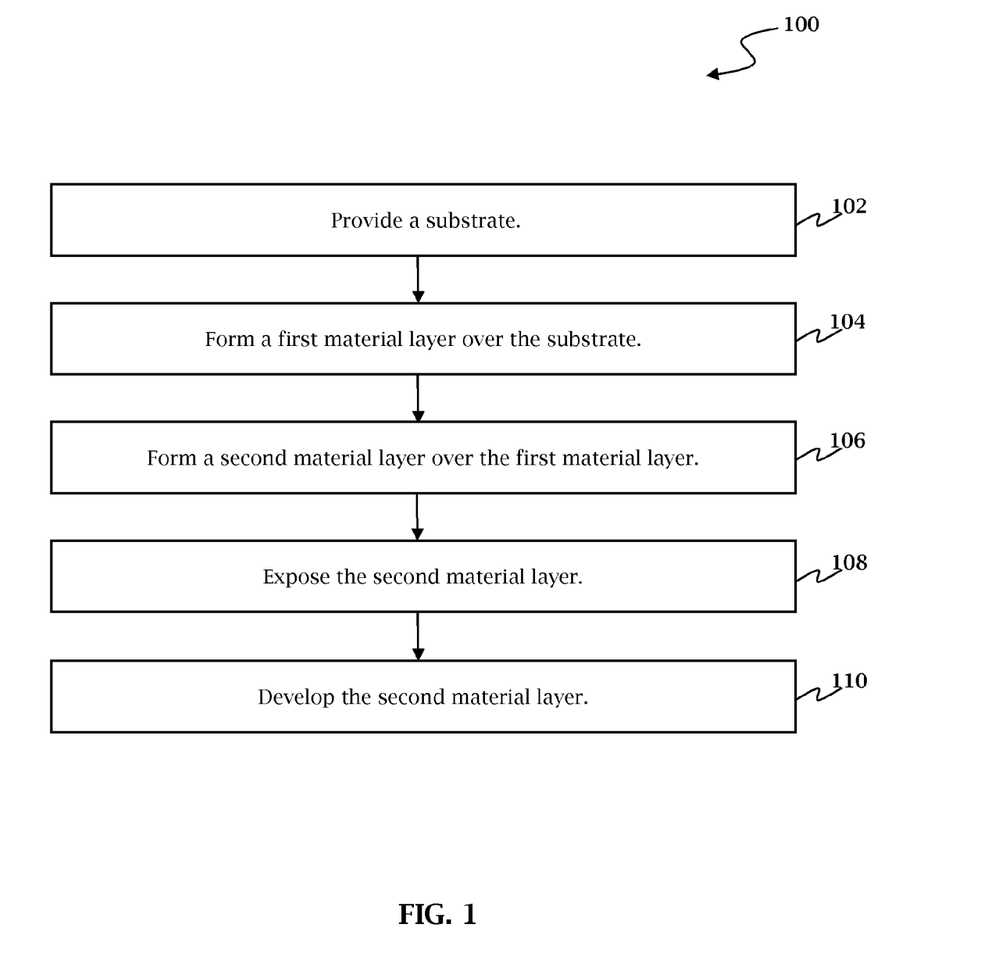
FIG. 1 is a flow chart of a method for fabricating a semiconductor device according to aspects of the present embodiments.
Figure 2A:
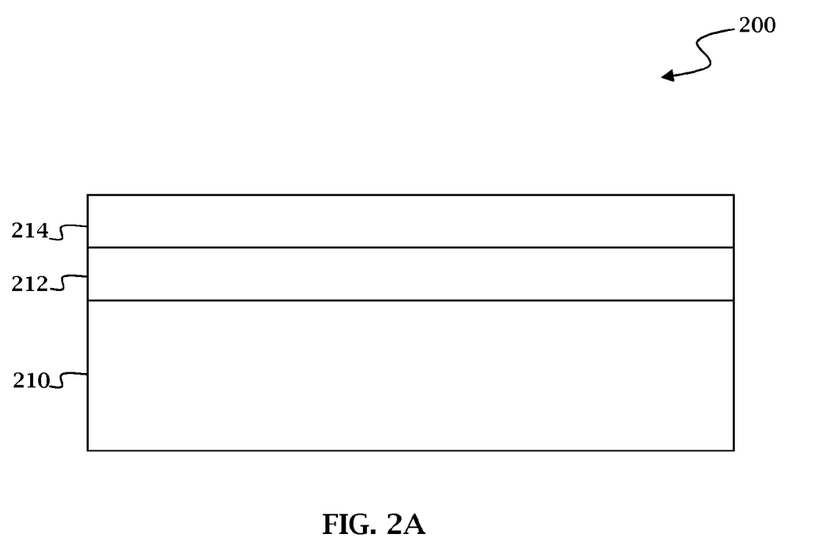
FIGS. 2A-2C are various cross-sectional views of embodiments of a semiconductor device during various fabrication stages according to the method of FIG. 1.
Figure 2B:
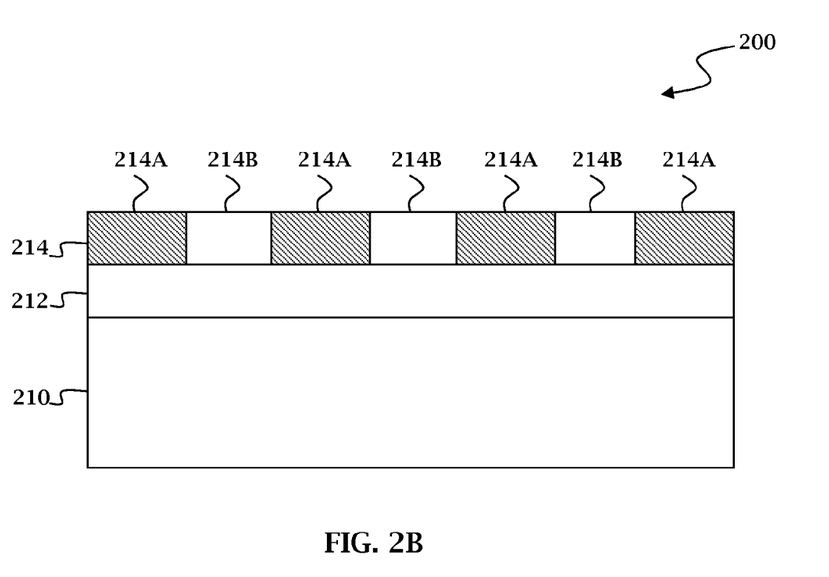
Figure 2C:
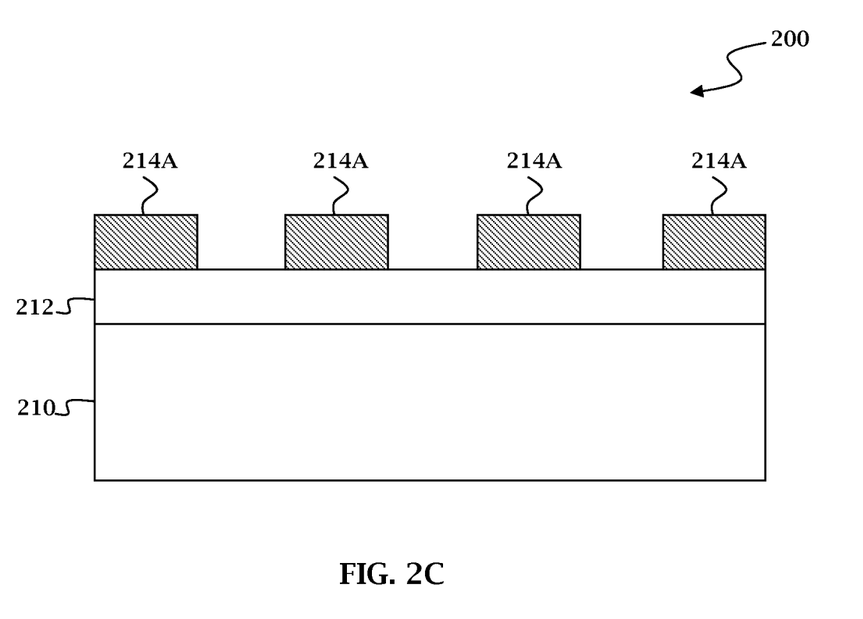

With reference to FIG. 1 and FIGS. 2A-2C, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. FIG. 1 is a flow chart of one embodiment of the method 100 for making the semiconductor device 200. FIGS. 2A-2C are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes, such as a post-exposure bake (PEB) or pre-exposure bake, may be performed before or after exposing the substrate. A developing process selectively removes the exposed or unexposed regions to a developing solution creating an exposure pattern over the substrate. A series of chemical treatments then engrave the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS, a substrate may go through the photolithographic cycle a number of times.

Referring to FIGS. 1 and 2A, the method 100 begins at block 102 wherein a substrate 210 is provided. The substrate 210 is a semiconductor substrate. The substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure. Alternatively, the substrate 210 includes a non-semiconductor material, such as a glass substrate for thin-film-transistor liquid crystal display (TFT-LCD) devices, or fused quartz or calcium fluoride for a photomask (mask).

The substrate 210 may comprise a material layer. The material layer comprises high-k dielectric layers, gate layers, hard mask layers, interfacial layers, capping layers, diffusion/barrier layers, dielectric layers, conductive layers, other suitable layers, and/or combinations thereof. A high-k dielectric layer can include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, other suitable high-k dielectric materials, and/or combinations thereof. A gate layer can include silicon-containing materials; germanium-containing materials; metal, such as aluminum, copper, tungsten, titanium, tantulum, titanium nitride, tantalum nitride, nickel silicide, cobalt silicide, TaC, TaSiN, and/or TaCN; other suitable materials; and/or combinations thereof. In an example, the gate layer comprises a layer of silicon dioxide and a layer of high-k dielectric material. The gate layer may be doped polycrystalline silicon with the same or different doping. The gate layer may comprise a work function layer. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some examples, the work function layer may include doped-conducting metal oxide materials.

At blocks 104 and 106, a first material layer 212 and a second material layer 214 are formed over the substrate 210. Alternatively, the first material layer 212 may be eliminated and the second material layer 214 may be formed over the substrate 210. The first material layer 212 comprises a different composition than the second material layer 214. The first and second material layers 212, 214 are coated on the substrate 210 to any suitable thickness by any suitable process, such as spin-on coating, chemical vapor deposition (CVD), plasma enhanced chemical vapor deposition (PECVD), atomic layer deposition (ALD), physical vapor deposition (PVD), high density plasma CVD (HDPCVD), other suitable methods, and/or combinations thereof. The first material layer 212 comprises a different optical property than the second material layer 214. For example, the first material layer 212 comprises substantially different refractive indexes (i.e., n values), extinction coefficients (i.e., k values), or T values than the second material layer 214. The first and second material layers 212, 214 further comprise different etching resistances.

The first material layer 212 is a patterning layer. The patterning layer comprises photoresist layers, antireflective coating layers (e.g., a top antireflective coating layer (TARC) and/or a bottom antireflective coating layer (BARC)), high-k dielectric layers, gate layers, hard mask layers, interfacial layers, capping layers, diffusion/barrier layers, dielectric layers, conductive layers, other suitable layers, and/or combinations thereof. The patterning layer may be similar to those described above. An exemplary first material layer 212 comprises silicon, silicon dioxide, silicon nitride, silicon carbide, silicon oxynitride, metal, metal alloy, metal oxide (e.g., $Al_2O_3$, hafnium oxide), metal nitride (e.g., TiN), metal oxynitride, siloxane, other suitable materials, and/or combinations thereof. Alternatively, the first material layer 212 comprises a BARC coating material, such as an organic BARC material. In yet another example, the first material layer 212 comprises at least one of an acid labile molecule, photoacid generator (PAG), quencher, chromophore, crosslinker, surfactant, and/or solvent.

The second material layer 214 is a photoresist layer. The photoresist layer is a positive-type or negative-type resist material and may have a multi-layer structure. One exemplary resist material is a chemical amplifying (CA) resist. The second material layer 214 comprises at least one of a polymer, a photoacid generator (PAG), a quencher (base), a chromophore, and/or a solvent. The polymer comprises an organic or inorganic polymer. The molecular weight of the polymer may be between approximately 2,000 and 20,000. The polymer may include an acid cleavable polymer, an acid catalyzed crosslinkable polymer, a polymeric pinacol, and/or other suitable polymer. The photoacid generator comprises any suitable material, and the amount of photoacid generator used is in the range from about 5% by weight to about 20% by weight of a polymer present in the second material layer 214. The second material layer 214 may further comprise a surfactant, a photodegradable base, an electron acceptor, and/or crosslinker. The electron acceptor can comprise at least one of the following: ketone, aldehyde, carboxylic acid, ester, amide, carbon dioxide, haloalkane, haloalkene, haloalkyne, alkene, alkyne, aromatic rings, other suitable groups, and/or combinations thereof.

Conventional photoresist layers comprise a non-photosensitive base. It has been observed that, after a patterning process, such conventional photoresist layers may exhibit poor resolution and/or sloped pattern profiles. Accordingly, photobase generators (i.e., photosensitive bases) have been introduced into photoresist compositions, such as the photobase generators disclosed in U.S. Pat. No. 6,395,451 to Jung, et al., entitled Photoresist Composition Containing Photo Base Generator with Photo Acid Generator, the entire disclosure of which is incorporated herein by reference. The photobase generators disclosed in U.S. Pat. No. 6,395,451 may reduce or improve sloping pattern and iso/dense (I/D) bias among different photoresist depths (characteristics focusing on a z-axis). These improvements can occur because a base is generated heavily on the upper portion of the photoresist layer (when a photobase generator is exposed to light/radiation), which neutralizes some of the acid generated heavily on the upper portion of the photoresist layer (when a photoacid generator is exposed to light/radiation). However, it has been observed that the disclosed photobase generators may not tighten and improve resolution (characteristics focusing on a x-axis).

The second material layer 214 comprises a photobase generator (PBG) that similarly may reduce sloping patterns and/or improve I/D bias. Additionally, in the present embodiment, the photobase generators tighten resolution to provide improved patterns, particularly as a pitch reaches 100 nm and below. The resolution of resulting patterns is improved by tuning characteristics of the second material layer 214 based on a conversion efficiency of the photobase generator. Typically, during an exposure process, the base amount generated by the photobase generator is substantially lower than the acid generated by the photoacid generator. The amount of base generated depends on the initial photobase generator loading (concentration), conversion efficiency, and/or mixing uniformity of the photobase generator with the other components of the photoresist layer (or second material layer 214). Thus, the characteristics of the second material layer 214 are tuned by determining (or establishing) a photobase generator conversion efficiency, and determining a reaction mechanism of the photobase generator based on the conversion efficiency. The reaction mechanism can be related to diffusion control and/or loading control. The characteristics of the photobase generator in the second material layer 214 may then be tuned depending on whether diffusion control or loading control is desired.

For example, assume that the second material layer 214 includes at least a polymer, a photoacid generator (PAG), such as triphenylsulfonium, and a photobase generator (PBG). The PAG exhibits a general conversion efficiency of about 30%, and the PAG loading (concentration of the PAG in second material layer 214) is in the range from about 5% by weight to about 20% by weight of the polymer. By determining (or establishing) the PBG conversion efficiency, a reaction mechanism of the PBG may be determined.

When the PBG exhibits lower conversion efficiency than the PAG, diffusion control is implemented by tuning the characteristics of the second material layer 214 to have PBG with a higher diffusion mobility than the PAG. In an example, the PAG exhibits a diffusion mobility (length) substantially lower than 10 $nm^2$/sec, so the second material layer 214 is tuned to have PBG exhibiting a diffusion mobility (length) greater than 10 $nm^2$/sec. After an exposure process, and accompanying diffusion, this results in a final base distribution contrast substantially lower than a final acid distribution. The base then depletes the acid and enhances the final acid distribution, providing an improved profile and tighter resolution. Alternatively, when the reaction mechanism of the PBG is diffusion control, the diffusion length of the PBG is about 10 $nm^2$/sec to about 30 $nm^2$/sec. The diffusion length of the PAG may be about 1 $nm^2$/sec to about 10 $nm^2$/sec.

When the PBG exhibits higher conversion efficiency than the PAG, loading control is implemented by tuning the characteristics of the second material layer 214 to have a PBG loading amount substantially lower than the PAG loading amount, such as less than about 5% by weight of the PAG. In the present example, the PBG loading may be substantially lower than 20% by weight of the PAG, such as the PBG loading being about 9% by weight of the polymer. When considering the profile of the pattern, this may result in a base distribution substantially wider than an acid distribution, with substantially constant base distribution in the central region of the profile, which can provide a maximum base amount restricted by a substantially low PBG loading amount. The base then depletes the acid and enhances the final acid distribution, providing an improved profile and tighter resolution. Alternatively, when the reaction mechanism of the PBG is loading control, the PBG loading amount may be from about 0.1% by weight to about 30% by weight of the PAG.

Examples of the photobase generator include at least one of a carbamate, a carbamoylhydroxylamine, oxime, sulfonamide, lactam (or cyclic amide), other suitable materials, and/or combinations thereof. An exemplary carbamate is represented by the formula:

Formula 1(a)

R1, R2, R3, R4, and/or R5 comprise a hydrogen, a hydroxide (—OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl(thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary carbamoylhydroxylamine is represented by the formula:

Formula 1(b)

R6, R7, R8, R9, and/or R10 comprise a hydrogen, a hydroxide (—OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl(thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary oxime is represented by the formula:

Formula 1(c)

R11, R12, and/or R13 comprise a hydrogen, a hydroxide (—OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl(thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary sulfonamide is represented by the formula:

Formula 1(d)

R14, R15, R16, R17, R18, R19, and/or R20 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl(thiol) (—SH), a lactone, an amide, a carboxylic acid, and/or ester functional group. It is understood that the straight or cyclic alkyl, alkoxyl, fluoroalkyl, or fluoroalkoxyl chain may comprise other suitable functional groups.

An exemplary lactam is represented by the formulas:

Formula 1(e)

Formula 1(f)

Formula 1(g)

Alternatively, the exemplary lactam is represented by the formula

Formula 1(h)

R21 and/or R22 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, or fluoroalkoxyl chain can comprise a hydroxide (—OH), an amine, a sulfhydryl(thiol) (—SH), a lactone, an amide, a carboxylic acid, and/or ester functional group. It is understood that the straight or cyclic alkyl, alkoxyl, fluoroalkyl, or fluoroalkoxyl chain may comprise other suitable functional groups. X is from about 2 to about 5.

At block 108, at least one exposure process is performed on the second material layer 214. The exposure process selectively illuminates the second material layer 214 by a radiation beam to form one or more exposed portions 214A and unexposed portions 214B as illustrated in FIG. 2B. The patterned exposed and unexposed portions 214A, 214B are formed by illuminating the second material layer with a radiation source through one or more photomasks (or reticles) to form an image pattern. The radiation beam used to expose the second material layer 214 may be ultraviolet and/or extended to include other radiation beams, such as ion beam, x-ray, extreme ultraviolet, deep ultraviolet, and other proper radiation energy. In an example, the second material layer 214 is exposed to a wavelength substantially less than 250 nm. The lithography process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam writing (e-beam). The exposing process may also be implemented or replaced by other proper methods such as maskless photolithography, ion-beam writing, and/or molecular imprint techniques. It is understood that a single exposure patterning process, double exposure patterning process, or multiple exposure patterning process may be performed. For example, the second material layer 214 can be exposed to a first wavelength, and then, subsequently exposed to a second wavelength. The second wavelength can be similar to the first wavelength, i.e., both wavelengths are substantially less than 250 nm. The second wavelength may be substantially different than the first wavelength.

Subsequently, the second material layer 214 may be subjected to a post-exposure bake (PEB) process. After a pattern exposure and/or post-exposure bake (PEB) process, the PAG in the second material layer 214 (i.e., photoresist) may produce an acid and thus increase or decrease its solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer or cause a polymeric pinacol to undergo pinacol rearrangement, resulting in the polymer becoming more hydrophobic).

As noted above, when formed, the second material layer 214 is tuned to include photobase generators exhibiting characteristics for diffusion control or loading control, such as the photobase generators described herein. Such tuning provides better control over the overall acid and base distribution that occurs during an exposure process. The base distribution may be modified to enhance the final acid distribution, which provides improved acid/base distribution contrast, resulting in an improved pattern profile. The modified base distribution particularly improves resolution (contrast) of the resulting pattern.

At block 110, the second material layer 214 is developed to form a pattern in the second material layer 214 by any suitable process as illustrated in FIG. 2C. A developing solution may be utilized to remove portions of the second material layer 214, such as tetramethylammonium hydroxide (TMAH). Any concentration level of TMAH developer solution may be utilized, such as approximately 2.38% TMAH developer solution. The developing solution may remove the exposed or unexposed portions 214A, 214B depending on the resist type. For example, in the present embodiment, the second material layer 214 comprises a negative-type resist, so the exposed portions 214A are not dissolved by the developing solution and remain over the first material layer 212 (or substrate 210). If the second material layer 214 comprises a positive-type resist, the exposed portions 214A would be dissolved by the developing solution, leaving the unexposed portions 214B.

The remaining exposed portions 214A (or unexposed portions 214B) define a pattern. The pattern contains one or more openings, wherein portions of the underlying first material layer 212 (or substrate 210) are exposed. It is understood that subsequent processing may include removing the exposed portions of the first material layer 212 and/or substrate 210 within the openings. Alternatively, metal deposition, ion implantation, or other processes can be carried out over/on the first material layer 212 and/or substrate 210. The patterned second material layer 214 may then be removed or stripped and subsequent processing may continue.

In summary, the disclosed embodiments provide a method for fabricating an integrated circuit device utilizing a photoresist layer having a photobase generator. The photobase generator comprises at least one of a carbamate, a carbamoylhydroxylamine, oxime, sulfonamide, lactam (or cyclic amide), other suitable materials, and/or combinations thereof. The reaction mechanisms of the photobase generator may be tuned to provide improved acid distribution and base distribution contrast, resulting ultimately in improved profile contrast (or resolution). The disclosed embodiments may provide one or more advantages, such as improved lithography resolution, patterning profiles, critical dimension uniformity, and/or circularity. Also, the disclosed method and photoresist material provide reduced iso/dense bias. It is understood that different embodiments may have different advantages, and that no particular advantage is necessarily required of all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pattern, the method comprising:
providing a substrate;
forming a first material layer over the substrate;
forming a second material layer over the first material layer, wherein the second material layer comprises a photoacid generator and a photobase generator, a photobase generator having a diffusion length ranging from about 10 $nm^2$/sec to about 30 $nm^2$/sec;
prior to forming the second material layer, determining whether a reaction mechanism of the photobase generator is loading control or diffusion control, the determination being based on a conversion efficiency of the photobase generator;
tuning characteristics of the second material layer according to the determination to provide diffusion control or loading control so that the photobase generator exhibits a higher diffusion mobility than the photoacid generator by including a loading amount of the photobase generator that is from about 0.1% to about 30% by weight of the photoacid generator; and
exposing one or more portions of the second material layer.

2. The method of claim 1 wherein forming the second material layer comprising the photobase generator comprises selecting the photobase generator from at least one of a carbamoylhydroxylamine, a sulfonamide, or a lactam.

3. The method of claim 1 further comprising:
performing a post-exposure baking process on the second material layer; and
developing the second material layer to form a pattern in the second material layer.

4. The method of claim 1 wherein exposing one or more portions of the second material layer comprises exposing the second material layer to radiation having a wavelength substantially less than 250 nm.

5. The method of claim 1 wherein exposing one or more portions of the second material layer comprises exposing the second material layer to a first wavelength and a second wavelength.

6. The method of claim 1, wherein the photobase generator comprises a sulfonamide.

7. The method of claim 1, wherein the photobase generator comprises a lactam.

8. A method of forming a pattern, the method comprising:
forming a first material layer over a substrate;
forming a second material layer over the first material layer, wherein the second material layer comprises a photoacid generator and a photobase generator, the photobase generator being selected from at least one of a carbamoylhydroxylamine, a sulfonamide, or a lactam, wherein the photobase generator has a diffusion length ranging from about 10 $nm^2$/sec to about 30 $nm^2$/sec;
prior to forming the second material layer, determining a conversion efficiency of the photobase generator and a conversion efficiency of the photoacid generator;
determining whether a reaction mechanism of the photobase generator is diffusion control or loading control based on a comparison of the conversion efficiencies;
tuning characteristics of the second material layer according to the determination to provide diffusion control or loading control so that the photobase generator exhibits a higher diffusion mobility than the photoacid generator by including a loading amount of the photobase generator that is from about 0.1% to about 30% by weight of the photoacid generator; and
exposing one or more portions of the second material layer.

9. The method of claim 8 wherein the loading amount of the photobase generator is less than about 5% by weight of the photoacid generator.

10. The method of claim 8, wherein the photobase generator is a carbamoylhydroxylamine.

11. The method of claim 8, wherein the photobase generator is a sulfonamide.

12. The method of claim 8, wherein the photobase generator is a lactam.

13. The method of claim 8, wherein the first material layer includes a metal material.

14. The method of claim 8, wherein the first material layer includes a material selected from the group consisting of silicon dioxide, silicon nitride, silicon carbide, and silicon oxynitride.

15. A method for forming a pattern, the method comprising:
- forming a material layer over a semiconductor substrate, wherein the material layer includes a photoacid generator and a photobase generator, wherein the photobase generator has a diffusion length ranging from about 10 $nm^2$/sec to about 30 $nm^2$/sec;
- tuning characteristics of the material layer so that the photobase generator exhibits a higher diffusion mobility than the photoacid generator by including a loading amount of the photobase generator that is from about 0.1% to about 30% by weight of the photoacid generator; and
- exposing one or more portions of the material layer.

16. The method of claim 15, wherein the material layer is a positive photoresist layer.

17. The method of claim 15, wherein the material layer is a negative photoresist layer.

18. The method of claim 15, further comprising forming another material layer over the substrate prior to forming the material layer of the substrate.

19. The method of claim 18, wherein the another material layer includes a metal material.

20. The method of claim 15, wherein the photobase generator is selected from the group consisting of a carbamate, a carbamoylhydroxylamine, an oxime, a sulfonamide, and a lactam.

* * * * *